(12) United States Patent
Mizumura

(10) Patent No.: US 7,858,484 B2
(45) Date of Patent: Dec. 28, 2010

(54) SEMICONDUCTOR DEVICE AND METHOD FOR PRODUCING THE SAME

(75) Inventor: Akira Mizumura, Tokyo (JP)

(73) Assignee: Sony Corporation, Tokyo (JP)

( * ) Notice: Subject to any disclaimer, the term of this patent is extended or adjusted under 35 U.S.C. 154(b) by 298 days.

(21) Appl. No.: 12/101,596

(22) Filed: Apr. 11, 2008

(65) Prior Publication Data

US 2008/0258232 A1  Oct. 23, 2008

(30) Foreign Application Priority Data

Apr. 17, 2007  (JP) .............................. 2007-107973

(51) Int. Cl.
*H01L 21/20* (2006.01)
(52) U.S. Cl. ................ 438/384; 438/392; 257/E21.004
(58) Field of Classification Search .......... 257/E21.004; 438/210, 382, 384
See application file for complete search history.

(56) References Cited

U.S. PATENT DOCUMENTS

| 4,897,360 | A  | * | 1/1990  | Guckel et al. ................... 216/2 |
| 6,362,066 | B1 | * | 3/2002  | Ryum et al. .................. 438/364 |
| 6,806,136 | B1 | * | 10/2004 | Hsu ........................... 438/238 |
| 7,365,397 | B2 | * | 4/2008  | Nomura ....................... 257/359 |
| 7,485,540 | B2 | * | 2/2009  | Chinthakindi et al. ....... 438/381 |
| 7,538,397 | B2 | * | 5/2009  | Kotani ......................... 257/380 |
| 7,622,345 | B2 | * | 11/2009 | Ting et al. ................... 438/238 |
| 2003/0181049 | A1 | * | 9/2003 | Huang et al. ................ 438/694 |
| 2005/0088491 | A1 | * | 4/2005 | Truninger et al. ............. 347/71 |
| 2005/0181556 | A1 | * | 8/2005 | Hsu ........................... 438/238 |
| 2005/0248397 | A1 | * | 11/2005 | Aota ........................... 327/567 |
| 2007/0096183 | A1 | * | 5/2007 | Ogawa et al. ............... 257/300 |
| 2008/0188053 | A1 | * | 8/2008 | Ting et al. .................... 438/382 |

FOREIGN PATENT DOCUMENTS

| JP | 57-211253    | 12/1982 |
| JP | 63-087762    | 4/1988  |
| JP | 06-005786    | 1/1994  |
| JP | 08-335701    | 12/1996 |
| JP | 2000-156420  | 6/2000  |
| JP | 2000-195966  | 7/2000  |
| JP | 2001-257272  | 9/2001  |
| JP | 2004-134802  | 4/2004  |
| JP | 2005-175262  | 6/2005  |
| JP | 2008-103501  | 5/2008  |
| JP | 2008-235798  | 10/2008 |

OTHER PUBLICATIONS

S. Yamaguchi et al.; High Performance Dual Metal Gate CMOS with High Mobility and Low Threshold Voltage Applicable to Bulk CMOS Technology; 2006 Symposium on VLSI Technology Digest of Technical Papers.

Office Action issued on Mar. 17, 2009, in the related Japanese application JP 2007-107973.

\* cited by examiner

*Primary Examiner*—Allan R Wilson
(74) *Attorney, Agent, or Firm*—SNR Denton US LLP

(57) ABSTRACT

A semiconductor device includes a substrate, an insulating film disposed on the substrate, a resistor groove disposed in the insulating film, and a resistor disposed in the resistor groove. The resistor is separated from all side surfaces of the resistor groove by a predetermined distance.

6 Claims, 6 Drawing Sheets

SEMICONDUCTOR DEVICE AND METHOD FOR PRODUCING THE SAME

CROSS REFERENCES TO RELATED APPLICATIONS

The present invention contains subject matter related to Japanese Patent Application JP 2007-107973 filed in the Japanese Patent Office on Apr. 17, 2007, the entire contents of which are incorporated herein by reference.

BACKGROUND OF THE INVENTION

1. Field of the Invention

The present invention relates to semiconductor devices and methods for producing the devices, and particularly to a semiconductor device including a transistor having a damascene gate and a resistor and a method for producing the device.

2. Description of the Related Art

A damascene process is used to form a wiring line in a method for producing a semiconductor device.

In the damascene process, for example, a wiring line is formed by forming a wiring-line groove in an insulating film on a substrate, depositing a conductive material in the wiring-line groove, and removing the conductive material deposited outside the groove by a method such as chemical mechanical polishing (CMP) without removing the conductive material deposited inside the groove.

Metal-oxide-semiconductor field-effect transistors (MOS-FETs or MOS transistors), a basic element of a semiconductor device, have increasingly been miniaturized to produce semiconductor devices with smaller sizes and higher packing densities. To keep up with such scaling, a reduction in gate length and the thickness of a gate insulating film has been demanded.

SiON-based insulating films, which have been used as gate insulating films, may no longer be suitable for use as gate insulating films because they cause increased leakage in generations of 32-nm design rules or later.

Accordingly, the use of high-k films as gate insulating films has been studied for their potential to have increased physical thickness.

A typical high-k film has low heat resistance and should therefore be formed after a high-temperature diffusion heat treatment for source and drain regions.

One method enabling this process is a damascene-gate process in which the above damascene process is used to form a gate electrode of a MOS transistor, as disclosed in, for example, Japanese Unexamined Patent Application Publication No. 8-335701 and Yamaguchi et al., "High Performance Duel Metal Gate CMOS with Mobility and Low Threshold Voltage Application to Bulk CMOS Technology", 2006 Symposium on VSLI Technology Digest of Technical Papers, IEEE, 2006, Vol. 6, pp. 192-193. According to another method, a gate electrode and a resistor are formed using the same material.

Referring to FIG. 6A, according to an example of a damascene-gate process in which a gate electrode and a resistor are formed using the same material, a dummy gate insulating film 112a and a dummy gate electrode 113a are formed in an active region defined in a semiconductor substrate 110 by an isolation insulating film 111, that is, by shallow trench isolation (STI). The dummy gate insulating film 112a and the dummy gate electrode 113a are used as a mask to form source/drain regions 114 by ion implantation.

At the same time as the formation of the dummy gate insulating film 112a and the dummy gate electrode 113a, a silicon oxide film 112b and a polysilicon layer 113b are formed on the isolation insulating film 111 using the same materials.

Next, an interlayer insulating film 115 is formed by depositing silicon oxide over the entire surface of the semiconductor substrate 110, including those of the dummy gate electrode 113a and the polysilicon layer 113b, by a method such as chemical vapor deposition (CVD). The top of the interlayer insulating film 115 is then polished by CMP until the surfaces of the dummy gate electrode 113a and the polysilicon layer 113b are exposed.

Referring to FIG. 6B, the dummy gate electrode 113a and the polysilicon layer 113b are removed by etching, and the dummy gate insulating film 112a and the silicon oxide film 112b are removed.

Thus, a gate-electrode groove 115a and a resistor groove 115b are formed in the interlayer insulating film 115.

Referring to FIG. 6C, a silicon oxide film is deposited over the surface of the semiconductor substrate 110, including the inner surfaces of the gate-electrode groove 115a and the resistor groove 115b, by a method such as CVD. A conductive layer is then deposited over the silicon oxide film so as to fill the gate-electrode groove 115a and the resistor groove 115b by a method such as CVD. The silicon oxide film and the conductive layer deposited outside the gate-electrode groove 115a and the resistor groove 115b are removed by a treatment such as CMP.

Thus, a gate insulating film 116a formed of the silicon oxide film and a gate electrode 117a formed of the conductive layer can be embedded in the gate-electrode groove 115a while a resistor 117b can be embedded in the resistor groove 115b with a silicon oxide film 116b disposed therebetween.

The damascene-gate process thus allows formation of a gate insulating film with low heat resistance after a high-temperature process. This provides the advantage of extending the range of options of conductive materials for gate electrodes because they are formed after the high-temperature process.

For the damascene-gate process, resistors such as those used for analog circuits are often formed at a large line width, for example, about 1 to 10 μm, so that variations in resistance can be suppressed. Such a large line width, however, results in formation of a dishing D, as shown in FIG. 6C, on the surface of the conductive layer constituting the resistor 117b after the CMP.

A dishing is a phenomenon by which a material embedded in a wide or large groove by a method such as CVD or sputtering is thinned toward the center of the groove after CMP planarization due to the characteristics of CMP.

In a damascene-gate process, a larger dishing occurs in a larger groove, due to the characteristics of CMP, because the CMP is performed on the final stage of the step of forming a gate electrode and a resistor.

In addition, variations due to the CMP itself contribute to variations in the size of the dishing.

Thus, a dishing occurs on a conductive layer when a resistor is formed by a damascene-gate process, and variations in the size of the dishing result in variations in the resistance of the resistor. This makes it difficult to form a resistor with high accuracy which is suitable for an analog circuit.

SUMMARY OF THE INVENTION

It is desirable to form a resistor with high accuracy by a damascene-gate process.

A semiconductor device according to an embodiment of the present invention includes a substrate, an insulating film disposed on the substrate, a resistor groove disposed in the insulating film, and a resistor disposed in the resistor groove. The resistor is separated from all side surfaces of the resistor groove by at least a predetermined distance.

In the above semiconductor device, the insulating film is disposed on the substrate, the resistor groove is disposed in the insulating film, and the resistor is disposed in the resistor groove. The resistor is separated from all side surfaces of the resistor groove by at least the predetermined distance.

The above semiconductor device has a resistor structure in which the resistor, formed by a damascene-gate process, is separated from all side surfaces of the resistor groove by the predetermined distance. In the damascene-gate process, a mask layer protects a uniform-thickness portion of a conductive layer so that the portion can be used alone as the resistor. This semiconductor device can therefore provide a resistor with high accuracy.

A method for producing a semiconductor device according to an embodiment of the present invention includes the steps of forming an insulating film on a substrate, forming a resistor groove in the insulating film, forming a conductive layer by depositing a conductive material over the entire surface of the substrate so as to fill the resistor groove, forming a mask layer in the resistor groove in a pattern separated from all side surfaces of the resistor groove by at least a predetermined distance, and forming a resistor by etching back the conductive layer using the mask layer as a mask.

In the above method for producing a semiconductor device, the insulating film is formed on the substrate, and the resistor groove is formed in the insulating film. Then, the conductive layer is formed by depositing the conductive material over the entire surface of the substrate so as to fill the resistor groove, the mask layer is formed in the resistor groove in the pattern separated from all side surfaces of the resistor groove by at least the predetermined distance, and the resistor is formed by etching back the conductive layer using the mask layer as a mask.

According to the above method for producing the semiconductor device, the mask layer, separated from all side surfaces of the resistor groove by the predetermined distance, protects a uniform-thickness portion of the conductive layer in the damascene-gate process so that the portion can be used alone to form the resistor. This method can therefore provide a resistor with high accuracy.

DESCRIPTION OF THE PREFERRED EMBODIMENTS

A semiconductor device and a method for producing the device according to an embodiment of the present invention will now be described with reference to the drawings.

Figure 1A:
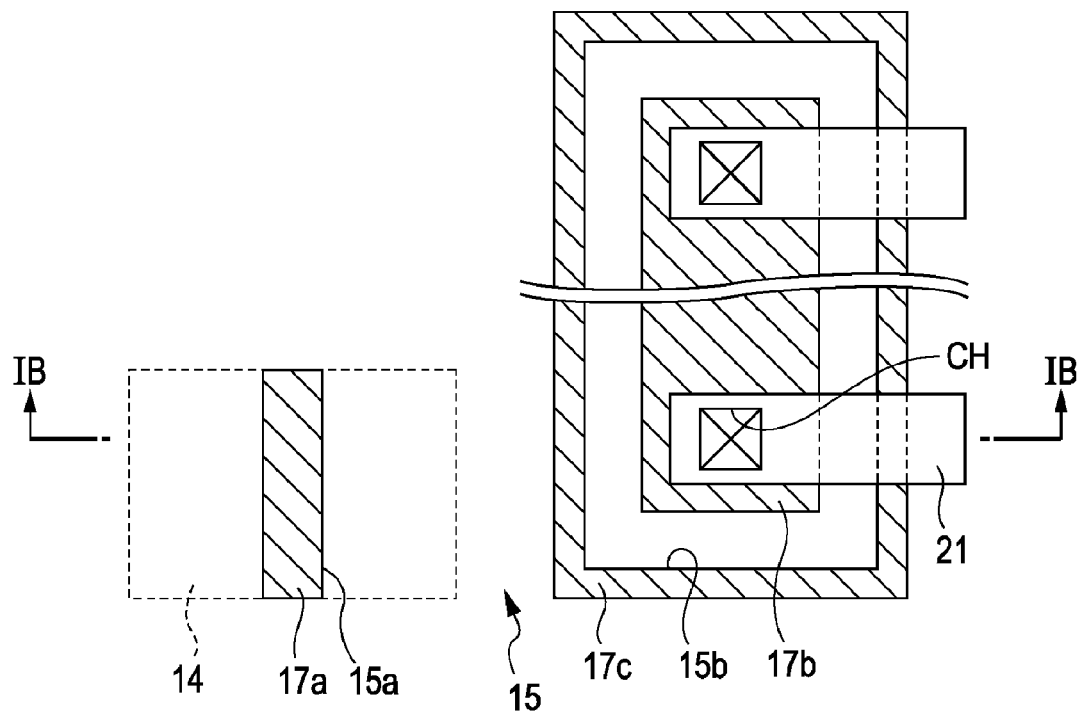
FIG. 1A is a layout diagram of a semiconductor device according to an embodiment of the present invention and FIG. 1B is a sectional view taken along line IB-IB of FIG. 1A.
Figure 1B:
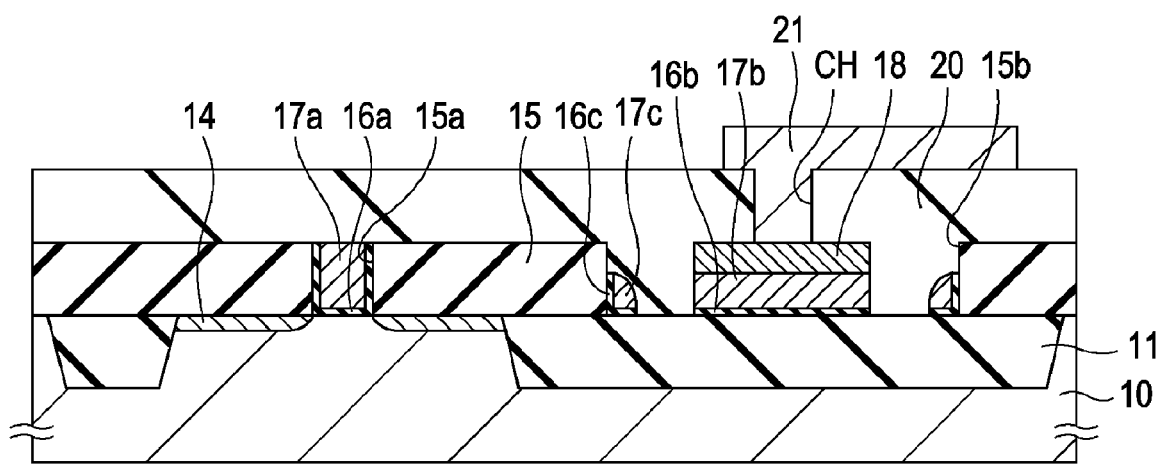

FIG. 1A is a layout diagram of the semiconductor device according to this embodiment, and FIG. 1B is a sectional view taken along line IB-IB of FIG. 1A.

For example, an isolation insulating film 11 is formed in a semiconductor substrate 10 formed of silicon and having a channel region to define an active region by STI, and an interlayer insulating film 15 formed of silicon oxide is disposed on the semiconductor substrate 10.

In addition, for example, a gate-electrode groove 15a is formed above the active region defined by the isolation insulating film 11, and a resistor groove 15b is formed above the isolation insulating film 11.

In addition, for example, a gate insulating film 16a is formed on the inner surfaces, including the bottom surface, of the gate-electrode groove 115a, a gate electrode 17a is formed on the gate insulating film 16a so as to fill the gate-electrode groove 15a, and source/drain regions 14 are formed in the semiconductor substrate 10 on both sides of the gate electrode 17a, thus constituting a field-effect transistor.

In addition, for example, a resistor 17b is formed on the bottom surface of the resistor groove 15b with an insulating film 16b disposed therebetween. The resistor 17b is separated from all side surfaces of the resistor groove 15b by a predetermined distance. A mask layer 18 formed of a material such as silicon nitride is disposed on the resistor 17b.

The resistor 17b, for example, has a pattern separated from all side surfaces of the resistor groove 15b by a predetermined distance, for example, A=0.3 to 0.5 μm. The resistor 17b itself may have, for example, a width of 0.4 μm and a length of several micrometers, depending on the design of the resistor 17b.

In the resistor groove 15b, for example, a conductive sidewall 17c is formed along the side surfaces of the resistor groove 15b with an insulating film 16c disposed therebetween so that the sidewall 17c surrounds the resistor 17b at a predetermined distance therefrom.

In addition, for example, an upper insulating film 20 is formed over the entire surface of the semiconductor substrate 10, including the surface of the mask layer 18 on the resistor 17b. The upper insulating film 20 is formed of silicon oxide. A pair of openings CH are formed in the upper insulating film 20 so as to reach the surface of the resistor 17b, and a pair of upper wiring lines 21 are formed in the openings CH and on the upper insulating film 20 so as to be connected to the resistor 17b.

Thus, the semiconductor device according to this embodiment is constituted.

In the semiconductor device according to this embodiment, preferably, the resistor 17b and the gate electrode 17a are formed of the same conductive material, for example, ruthenium, titanium nitride, hafnium silicide, tungsten, or polysilicon. In addition, a multilayer film including a layer of ruthenium, titanium nitride, or hafnium silicide and a tungsten layer formed thereon may be used.

In the semiconductor device according to this embodiment, preferably, the gate insulating film 16a is a metal oxide film having a higher dielectric constant than silicon oxide, namely, a high-k film. The metal oxide film used may be formed of, for example, hafnium oxide, hafnium oxynitride, aluminum oxide, or aluminum oxynitride.

The semiconductor device according to this embodiment, as described above, has a resistor structure in which the resistor 17b, formed by a damascene-gate process, is separated from all side surfaces of the resistor groove 15b by a predetermined distance. In the damascene-gate process, the mask layer 18 protects a uniform-thickness portion of a conductive layer so that the portion can be used alone to form the resistor 17b. This semiconductor device can therefore provide a resistor with high accuracy.

Next, the method for producing the semiconductor device according to this embodiment will be described with reference to the drawings.

Figure 2A:
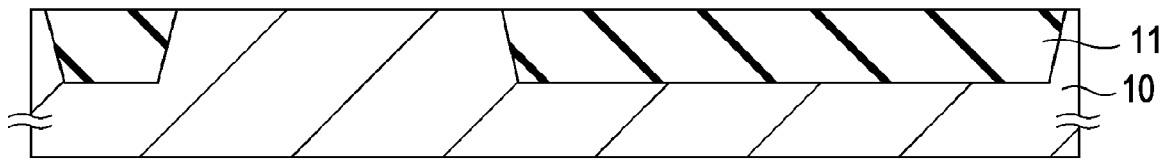
FIGS. 2A to 2C are schematic sectional views illustrating steps of a method for producing the semiconductor device according to the embodiment of the present invention.

Referring to FIG. 2A, for example, the isolation insulating film 11 is formed in the semiconductor substrate 10, formed of silicon and having the channel region, to define the active region by STI.

Figure 2B:
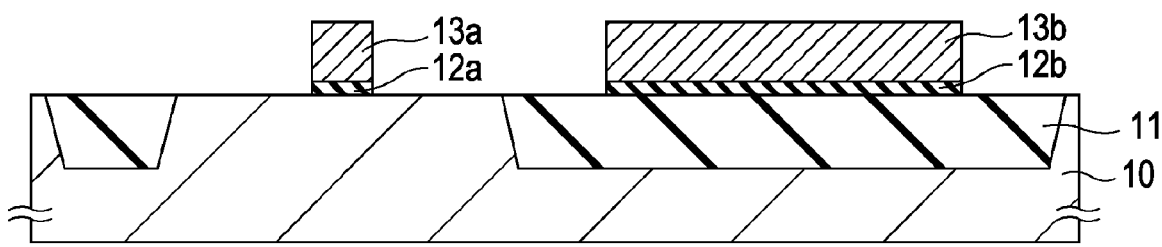

Referring to FIG. 2B, for example, silicon oxide and polysilicon are sequentially deposited over the entire surface of the semiconductor substrate 10 by a method such as CVD and are etched by photolithography so that they remain in regions where the gate electrode 17a and the resistor 17b are to be formed. As a result, a silicon oxide dummy gate insulating film 12a and a polysilicon dummy gate electrode 13a are formed in the region where the gate electrode 17a is to be formed in the active region of the semiconductor substrate 10, and a silicon oxide film 12b and a polysilicon layer 13b are formed in the region where the resistor 17b is to be formed on the isolation insulating film 11. As an alternative process, the deposition of polysilicon may be followed by deposition of silicon nitride to form a hard mask layer. In this case, the dummy gate electrode 13a and the polysilicon layer 13b have a multilayer structure including the polysilicon layer and the hard mask layer.

Figure 2C:
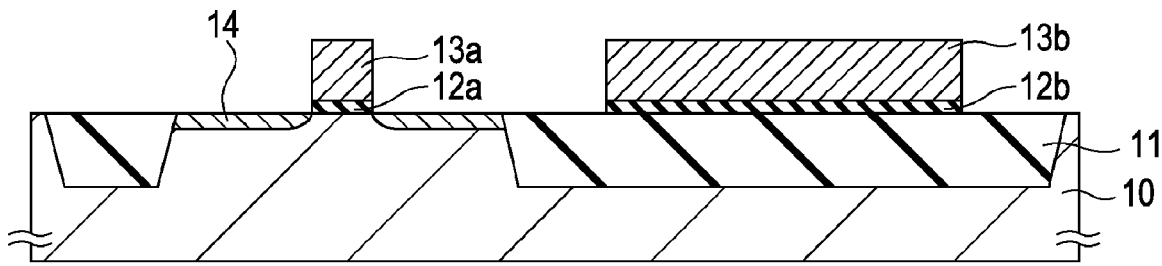

Referring to FIG. 2C, for example, the source/drain regions 14 are formed in the active region of the semiconductor substrate 10 using the dummy gate electrode 13a as a mask by ion implantation.

The source/drain regions 14 are then subjected to a heat treatment in a diffusion furnace for impurity activation.

Figure 3A:
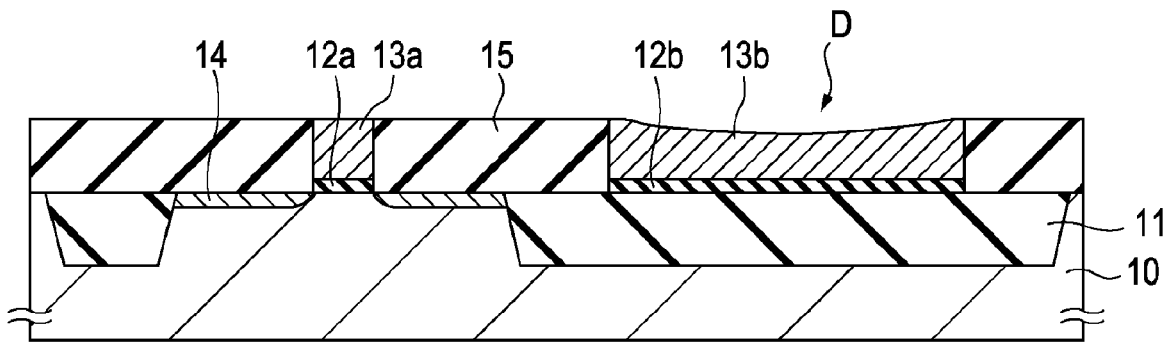
FIGS. 3A to 3C are schematic sectional views illustrating steps of the method for producing the semiconductor device according to the embodiment of the present invention.

Referring to FIG. 3A, for example, an interlayer insulating film 15 is formed by depositing silicon oxide over the entire surface of the semiconductor substrate 10, including those of the dummy gate electrode 13a and the polysilicon layer 13b, by a method such as CVD, and the top of the interlayer insulating film 15 is polished by CMP until the surfaces of the dummy gate electrode 13a and the polysilicon layer 13b are exposed. As a result, a dishing D occurs on the polysilicon layer 13b in the region where the resistor 17b is to be formed, which is wider than the region where the gate electrode 17a is to be formed. If the dummy gate electrode 13a and the polysilicon layer 13b have the multilayer structure including the polysilicon layer and the hard mask layer, as described above, the interlayer insulating film 15 may be polished by CMP until the polysilicon layer is exposed, or it may be exposed by polishing the interlayer insulating film 15 until the hard mask layer is exposed and then selectively removing the hard mask layer by dry etching.

Figure 3B:
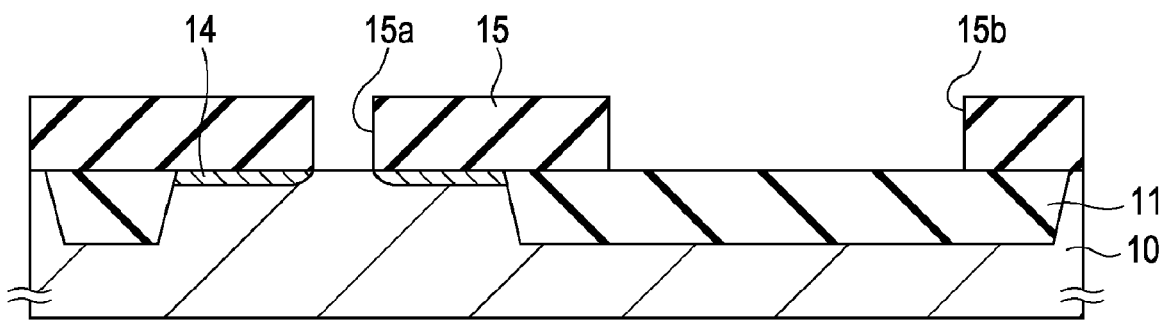

Referring to FIG. 3B, for example, etching is performed under predetermined conditions to remove the dummy gate electrode 13a and the polysilicon layer 13b and is successively performed under different conditions to remove the dummy gate insulating film 12a and the silicon oxide film 12b.

Thus, the gate-electrode groove 15a and the resistor groove 15b are formed in the interlayer insulating film 15.

Figure 3C:
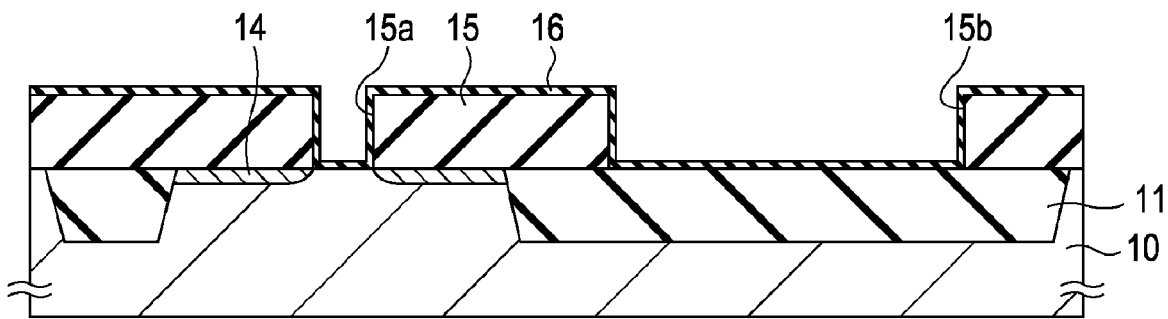

Referring to FIG. 3C, for example, a film 16 having a higher dielectric constant than silicon oxide, namely, a high-k film, such as a hafnium oxide film or an aluminum oxide film, is formed over the surface of the semiconductor substrate 10, including the inner surfaces of the gate-electrode groove 15a and the resistor groove 15b, by a method such as CVD or atomic layer deposition (ALD). The film 16 may also be formed of silicon oxide. As an alternative process, the dummy gate insulating film 12a may be used as the gate insulating film 16a without being removed. In this case, the step of FIG. 3C is omitted.

The steps following the step of forming the high-k film 16 are performed at treatment temperatures of less than 500° C. because the high-k film 16 has low heat resistance.

Figure 4A:
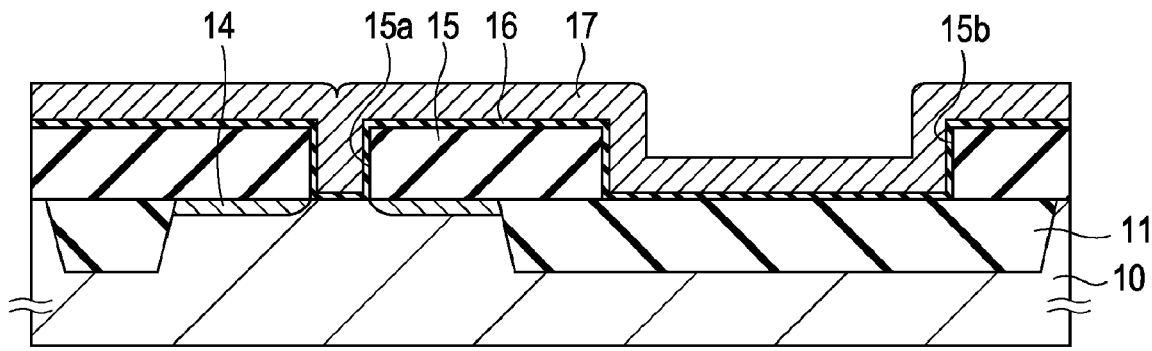
FIGS. 4A to 4C are schematic sectional views illustrating steps of the method for producing the semiconductor device according to the embodiment of the present invention.

Referring to FIG. 4A, for example, a conductive layer 17 is formed by depositing a conductive material such as ruthenium, tungsten, or polysilicon over the surface of the high-k film 16 by a method such as sputtering or CVD so as to cover the inner surfaces of the gate-electrode groove 15a and the resistor groove 15b. The conductive layer 17 is formed to such a thickness that it completely fills the gate-electrode groove 15a. Although the thickness of the conductive layer 17 in the resistor groove 15b is about half the depth of the resistor groove 15b in the drawings, it may have a thickness equivalent to the depth of the resistor groove 15b.

The conductive layer 17 typically has a thickness slightly exceeding the gate length of the gate electrode 17a, that is, half the width of the gate-electrode groove 15a. For example, if the largest gate length of transistors is 0.25 μm, the conductive layer 17 may have a thickness of about 0.3 μm.

Figure 4B:
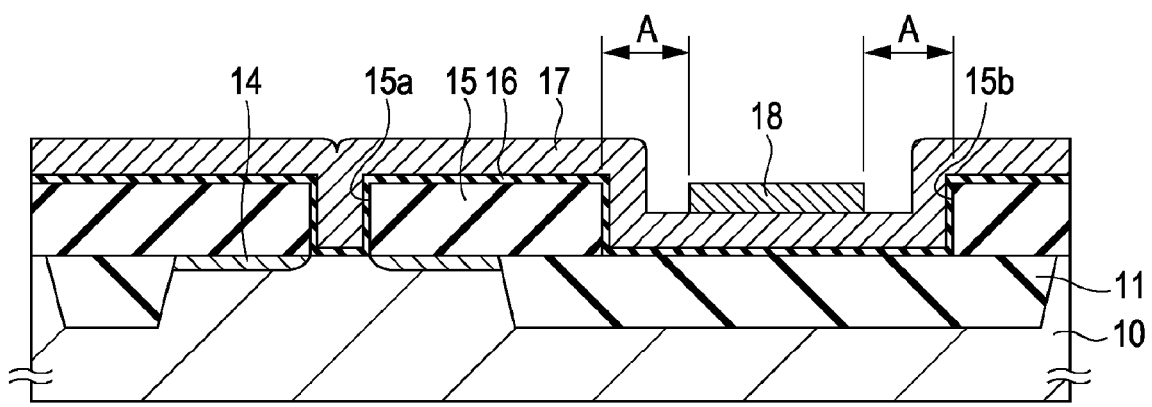

Referring to FIG. 4B, for example, the mask layer 18 is formed by depositing silicon nitride over the entire surface of the semiconductor substrate 10 by CVD and then etching the silicon nitride by photolithography so that a resistor pattern remains in the resistor groove 15b.

The mask layer 18, used as a mask to process the conductive layer 17, is formed of a material that provides high selectivity in etching or polishing.

If the conductive layer 17 is formed of tungsten and the mask layer 18 is formed of silicon nitride, for example, the silicon nitride is etched by the following processing conditions:

Two-frequency excitation CCP system
Source/bottom power: 1,000/500 W
Etching gas flow rate: $CHF_3$: 100 sccm; Ar: 400 sccm; $O_2$: 20 sccm
Pressure: 30 mTorr The resistor pattern is separated from all side surfaces of the resistor groove 15b by a predetermined distance, for example, A=0.3 to 0.5 μm. The pattern of the mask layer 18, which becomes the resistor pattern, may have, for example, a width of 0.4 μm and a length of several micrometers, depending on the design of the resistor 17b.

The thickness of the conductive layer 17 in the resistor groove 15b is less uniform near the wall surfaces because the conductive layer 17 is raised along the wall surfaces. The distance A is determined so that a uniform-thickness portion of the conductive layer 17 can be used as the resistor 17b and that no short circuit occurs between the resistor 17b and the sidewall 17c after the conductive layer 17 is divided into the resistor 17b and the sidewall 17c in the subsequent process. Consideration should also be given to possible misalignment between the mask layer 18 and the resistor groove 15b.

With the above considerations, the distance A is determined to be, for example, about 0.15 μm larger than the thickness of the conductive layer 17.

Figure 4C:
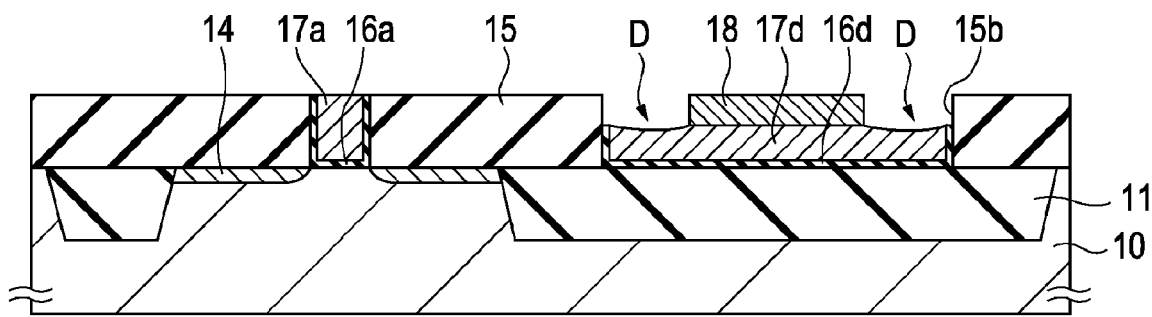

Referring to FIG. 4C, for example, the top of the conductive layer 17 is polished by CMP until the interlayer insulating film 15 is exposed.

In the region where the gate-electrode groove 15a has been formed, a portion of the conductive layer 17 outside the gate-electrode groove 15a is removed, so that the gate electrode 17a remains in the gate-electrode groove 15a.

In the region where the resistor groove 15b has been formed, a portion of the conductive layer 17 outside the resistor groove 15b is removed, so that a conductive layer 17d remains on the bottom of the resistor groove 15b. The mask layer 18 is slightly thinned but is not completely removed, and a small dishing D occurs in the region between the mask layer 18 and the inner surfaces of the resistor groove 15b.

Figure 5A:
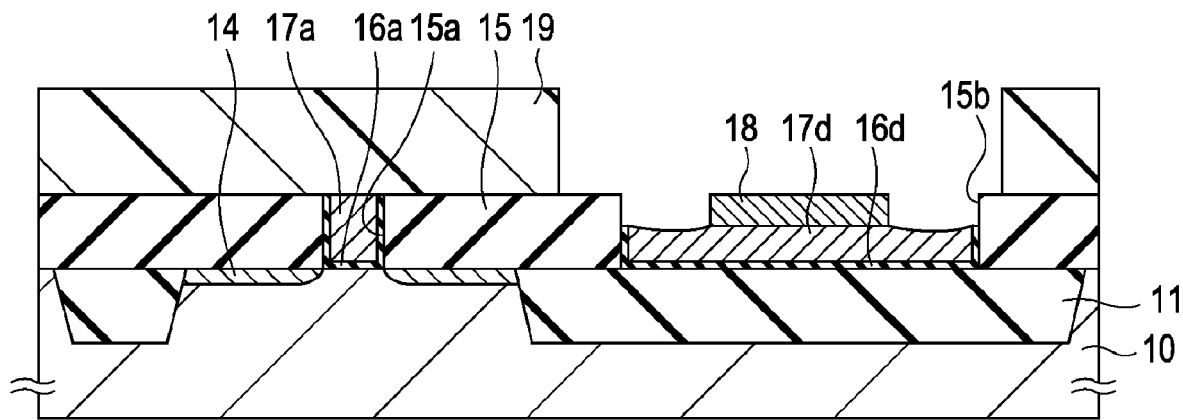
FIGS. 5A and 5B are schematic sectional views illustrating steps of the method for producing the semiconductor device according to the embodiment of the present invention.

Referring to FIG. 5A, for example, a resist film 19 is formed by photolithography in a pattern surrounding the region where the resistor groove 15b has been formed.

Figure 5B:
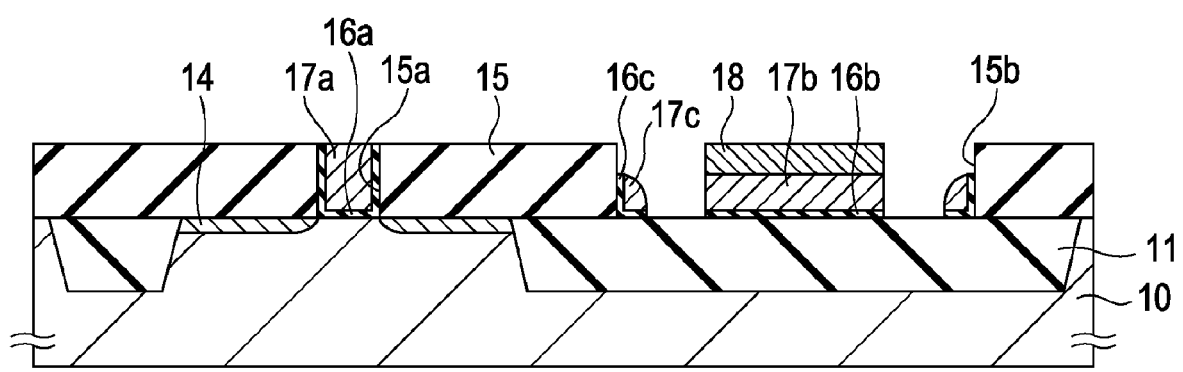
Figure 6A:
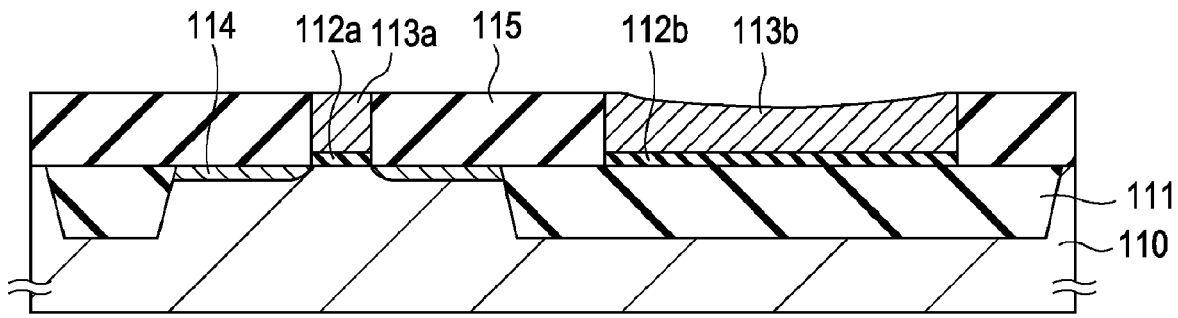
FIGS. 6A to 6C are schematic sectional views illustrating steps of a method for producing a semiconductor device of the related art.
Figure 6B:
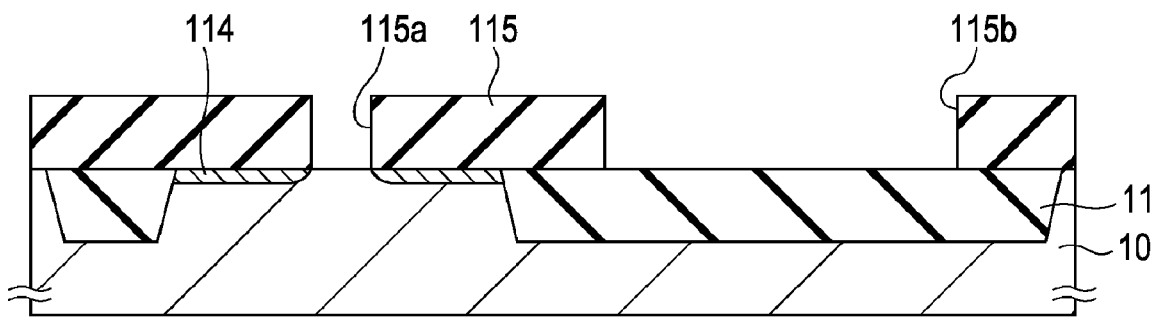
Figure 6C:
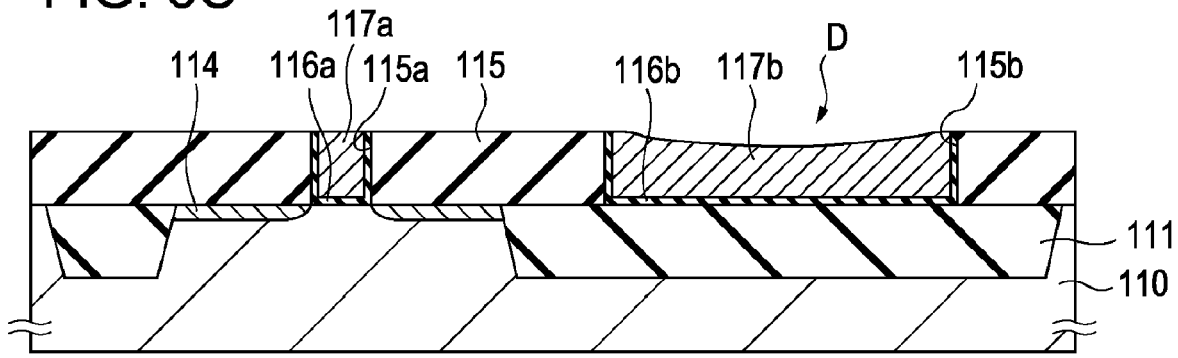

Referring to FIG. 5B, for example, the conductive layer 17d is etched back in the region where the resistor groove 15b has been formed using the mask layer 18 as a mask by an etching method such as reactive ion etching (RIE). Thus, the resistor 17b is formed in the same pattern as the mask layer 18, that is, in a pattern separated from all side surfaces of the resistor groove 15b by at least a predetermined distance in the resistor groove 15b. The insulating film 16b is also processed into the same pattern.

At the same time, the conductive sidewall 17c is formed along the side surfaces of the resistor groove 15b with the insulating film 16c disposed therebetween so that the sidewall 17c surrounds the resistor 17b at a predetermined distance therefrom.

If the conductive layer 17 is formed of tungsten and the mask layer 18 is formed of silicon nitride, the conductive layer 17d is etched by the following RIE conditions:

RIE with electron cyclotron resonance (ECR) ion source
Etching gas flow rate: $Cl_2$: 50 sccm; $SF_6$: 20 sccm; $O_2$: 20 sccm
Microwave power: 1,000 W
Bias power: 300 W
Pressure: 10 mTorr The subsequent process is exemplified as follows. The upper insulating film 20 is formed by depositing silicon oxide over the entire surface of the semiconductor substrate 10, including the surface of the mask layer 18 on the resistor 17b, by CVD. The pair of openings CH are formed in the upper insulating film 20 so as to reach the surface of the resistor 17b by photolithography and etching. The pair of upper wiring lines 21 are formed in the openings CH and on the upper insulating film 20 so as to be connected to the resistor 17b by, for example, depositing a conductive layer by a method such as sputtering or CVD and then etching the layer.

Thus, the semiconductor device according to this embodiment can be produced.

In the method for producing the semiconductor device according to this embodiment, preferably, the resistor 17b and the gate electrode 17a are formed of the same conductive material.

In the method for producing the semiconductor device according to this embodiment, preferably, a film having a higher dielectric constant than silicon oxide, namely, a high-k film, such as a hafnium oxide film or an aluminum oxide film, is formed as the gate insulating film 16a.

In the method for producing the semiconductor device according to this embodiment, as described above, the resistor 17b, formed by the damascene-gate process, is separated from all side surfaces of the resistor groove 15b by a predetermined distance. In the damascene-gate process, the mask layer 18 protects the uniform-thickness portion of the conductive layer 17d so that the portion can be used alone to form the resistor 17b. This method can therefore provide a resistor with high accuracy.

The present invention is not limited to the embodiment described above.

For example, although the gate electrode 17a and the resistor 17b are preferably formed of the same material, another material may also be used.

The mask layer 18, which remains deposited in the above embodiment, may be removed after the formation of the resistor 17b.

The MOS transistor used may be either an n-channel transistor or a p-channel transistor. A CMOS transistor may also be used.

Various other modifications are permitted without departing from the spirit of the present invention.

It should be understood by those skilled in the art that various modifications, combinations, sub-combinations and alterations may occur depending on design requirements and other factors insofar as they are within the scope of the appended claims or the equivalents thereof.

What is claimed is:

1. A method for producing a semiconductor device, comprising the steps of:
   forming an insulating film on a substrate;
   forming a resistor groove in the insulating film;
   forming a conductive layer by depositing a conductive material over the entire surface of the substrate so as to fill the resistor groove;
   forming a mask layer in the resistor groove in a pattern separated from all side surfaces of the resistor groove by at least a predetermined distance; and
   forming a resistor by etching back the conductive layer using the mask layer as a mask until a surface of said substrate is exposed and respective gaps are created between the resistor and each sidewall of the groove.

2. The method for producing a semiconductor device according to claim 1, further comprising the step of forming a pair of upper wiring lines on the resistor so that the upper wiring lines are connected to the resistor after the step of forming the resistor.

3. A method for producing a semiconductor device, comprising the steps of:
   forming an insulating film on a substrate;
   forming a resistor groove in the insulating
   forming a conductive layer by depositing a conductive material over the entire surface of the substrate so as to fill the resistor groove;
   forming a mask layer in the resistor groove in a pattern separated from all side surfaces of the resistor groove by at least a predetermined distance; and
   forming a resistor by etching back the conductive layer using the mask layer as a mask,
   wherein,
      the substrate used is a semiconductor substrate having a channel region,
      the method further comprises the steps of forming a dummy gate electrode and a dummy resistor on the substrate and forming source/drain regions in the substrate using the dummy gate electrode as a mask before the step of forming the insulating film on the substrate,
      in the step of forming the insulating film, the insulating film is formed so as to cover the dummy gate electrode and the dummy resistor, and the top of the insulating film is removed until the dummy gate electrode and the dummy resistor are exposed, in the step of forming the resistor groove in the insulating film, the dummy resistor is removed to form the resistor groove, and the dummy gate electrode is removed to form a gate-electrode groove, the method further comprises the step of forming a gate insulating film before the step of forming the conductive layer, in the step of forming the conductive layer, a conductive material is deposited on the gate insulating film so as to fill the gate-electrode groove, and the method further comprises the step of forming a gate electrode by removing a portion of the conductive layer outside the gate-electrode groove and a portion of the conductive layer outside the resistor groove by polishing, thereby forming a field-effect transistor.

4. The method for producing a semiconductor device according to claim 3, wherein the resistor and the gate electrode are formed of the same conductive material.

5. The method for producing a semiconductor device according to claim 3, wherein the gate insulating film is formed of a film having a higher dielectric constant than silicon oxide.

6. The method for producing a semiconductor device according to claim 5, wherein the gate insulating film is formed of a metal oxide film.

\* \* \* \* \*